United States Patent
Pickerd (10) Patent No.: US 12,092,692 B2
(45) Date of Patent: *Sep. 17, 2024

(54) CYCLIC LOOP IMAGE REPRESENTATION FOR WAVEFORM DATA

(71) Applicant: Tektronix, Inc., Beaverton, OR (US)

(72) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/345,283

(22) Filed: Jun. 11, 2021

(65) Prior Publication Data

US 2021/0389349 A1 Dec. 16, 2021

Related U.S. Application Data

(60) Provisional application No. 63/177,930, filed on Apr. 21, 2021, provisional application No. 63/041,041, (Continued)

(51) Int. Cl.
*G01R 31/319* (2006.01)
*G01R 13/02* (2006.01)
(Continued)

(52) U.S. Cl.
CPC ... *G01R 31/31908* (2013.01); *G01R 13/0272* (2013.01); *G01R 31/31708* (2013.01); *G01R 31/31905* (2013.01); *G06N 20/00* (2019.01)

(58) Field of Classification Search
CPC .......... G01R 31/31908; G01R 31/0272; G01R 31/31708; G01R 31/31905; G06N 20/00
(Continued)

(56) References Cited

U.S. PATENT DOCUMENTS 5,013,978 A * 5/1991 Macaulay ............... H04N 3/27
315/367
7,356,077 B2 4/2008 Fala et al.
(Continued)

FOREIGN PATENT DOCUMENTS

EP 0416289 3/1991
JP 2002017728 A * 1/2002

OTHER PUBLICATIONS

Pickerd et al., U.S. Appl. No. 17/345,312, filed Jun. 11, 2021. (Year: 2021).*

(Continued)

*Primary Examiner* — Michael P Nghiem
(74) *Attorney, Agent, or Firm* — Miller Nash LLP; Andrew J. Harrington (57) ABSTRACT

A test and measurement instrument includes an input to receive a non-return-to-zero (NRZ) waveform signal from a device under test, a ramp generator to use the NRZ waveform signal to generate a ramp sweep signal, a gate to gate the ramp sweep signal and the NRZ waveform signal to produce gated X-axis and Y-axis data, and a display to display the gated X-axis and Y-axis data as a cyclic loop image. A method of generating a cyclic loop image includes receiving an input waveform, using the input waveform to generate a ramp sweep signal, gating the ramp sweep signal and the input waveform to produce gated X-axis and Y-axis data, and displaying the gated X-axis and Y-axis data as a cyclic loop image.

10 Claims, 11 Drawing Sheets

Related U.S. Application Data filed on Jun. 18, 2020, provisional application No. 63/039,360, filed on Jun. 15, 2020, provisional application No. 63/038,040, filed on Jun. 11, 2020.

(51) Int. Cl.
*G01R 31/317* (2006.01)
*G06N 20/00* (2019.01)

(58) Field of Classification Search
USPC .......................................................... 702/67
See application file for complete search history.

(56) References Cited

U.S. PATENT DOCUMENTS

| | | | |
|---|---|---|---|
| 7,379,830 B2 | 5/2008 | Onu | |
| 2004/0166817 A1* | 8/2004 | Mokhtari | H04L 27/06 |
| | | | 455/73 |
| 2004/0202267 A1 | 10/2004 | Karlquist | |
| 2005/0186929 A1 | 8/2005 | Rathbun | |
| 2005/0273285 A1* | 12/2005 | Onu | G11B 20/1403 |
| 2021/0389373 A1* | 12/2021 | Pickerd | G01R 13/029 |
| 2021/0390456 A1* | 12/2021 | Pickerd | G01R 13/029 |

OTHER PUBLICATIONS

Pickerd et al., U.S. Appl. No. 17/345,342, filed Jun. 11, 2021. (Year: 2021).*
Definition of gated, printed Apr. 15, 2023. (Year: 2023).*
Definition of gated, Merriam-Webster dictionary, printed Apr. 15, 2023. (Year: 2023).*
English translation of JP2002017728, Jan. 22, 2002. (Year: 2002).*
Korean Intellectual Property Office, International Search Report and Written Opinion for International Application No. PCT/US2021/036959, Oct. 1, 2021, 9 pages, Daejeon, Republic of Korea.

* cited by examiner

CYCLIC LOOP IMAGE REPRESENTATION FOR WAVEFORM DATA

RELATED APPLICATIONS

This disclosure claims the benefit of U.S. Provisional Pat. App. No. 63/038,040, titled "PAM4 CYCLIC EYE IMAGE REPRESENTATION FOR WAVEFORM DATA," filed Jun. 11, 2020, U.S. Provisional Pat. App. No. 63/039,360, titled "READ/WRITE BURST SEPARATION AND MEASUREMENT USING NOVEL CYCLIC EYE PLOT AND MACHINE LEARNING," filed Jun. 15, 2020, U.S. Provisional Pat. App. No. 63/041,041, titled "CYCLIC EYE IMAGE REPRESENTATION FOR WAVEFORM DATA," filed Jun. 18, 2020, and U.S. Provisional Pat. App. No. 63/177,930, titled "CYCLIC EYE WITH MACHINE LEARNING FOR MEASURING OR TUNING AN OPTICAL TRANSMITTER," filed Apr. 21, 2021, each of which hereby incorporated herein by reference in their entirety.

This disclosure is related to the following patent applications: U.S. patent application Ser. No. 17/345,342, filed Jun. 11, 2021, with the title, "SYSTEM AND METHOD FOR SEPARATION AND CLASSIFICATION OF SIGNALS USING CYCLIC LOOP IMAGES" and U.S. patent application Ser. No. 17/345,312, filed Jun. 11, 2021, with the title, "SYSTEM AND METHOD FOR MULTI-LEVEL SIGNAL CYCLIC LOOP IMAGE REPRESENTATIONS FOR MEASUREMENTS AND MACHINE LEARNING,".

TECHNICAL FIELD

This disclosure relates to generation of images for signal analysis and measurement, more particularly to transformation of binary coded signal waveforms into images usable for signal separation and identification.

BACKGROUND

In some situations, identifying acquired bursts of data on two-way buses and classifying in which direction the data signal is traveling is useful. If test and measurement instruments like oscilloscopes had unlimited channels, it would provide the ability to acquire the needed command bus lines to separate read and write bursts on such bi-directional buses. However, it becomes a challenge when only one or two probes are available.

An example of such a signal is in DDR5 memory, the standard for double-data rate version 5 memory. This represents the next major change in computing memory increasing speed and density but keeping a similarly dimensioned DIMM (dual in-line memory module). The system channel characteristics differ significantly between read and write operations as seen at the probe point. The read signals must be processed and measured separately from the write signals, so they must be separated.

Typically, the DQS clock strobe signal and the DQ data signal have the most interest for analysis. A minimum of two probes are required. In previous DDR versions, the DQS signal has a preamble that occurred before each burst that allowed for locating the beginning of the read or write data. With DDR5, the coding for identification resides on other command lines to which probes cannot easily be connected.

Embodiments of the disclosed apparatus and methods address shortcomings in the prior art.

DETAILED DESCRIPTION

Embodiments of the disclosure address the problem of identifying the bursts of data on two-way buses. The embodiments describe a method to create a cyclic loop image for use in identifying signals and facilitating some measurements. Embodiments create an XY image plot that is more sparse than traditional eye diagrams, so-called because they form what looks like an eye in the waveforms. The cyclic loop differs from an eye diagram because it represents time-ordered waveform data plotted along a horizontal time axis left to right during one polarity of signal level transitions (e.g. rising edges), and then back right to left during the opposite polarity of signal level transitions (e.g. falling edges) to form a loop. The resulting cyclic loop image is well-suited for input to existing pre-trained neural networks or other machine learning systems that can process and classify small images.

Figures 1, 2:
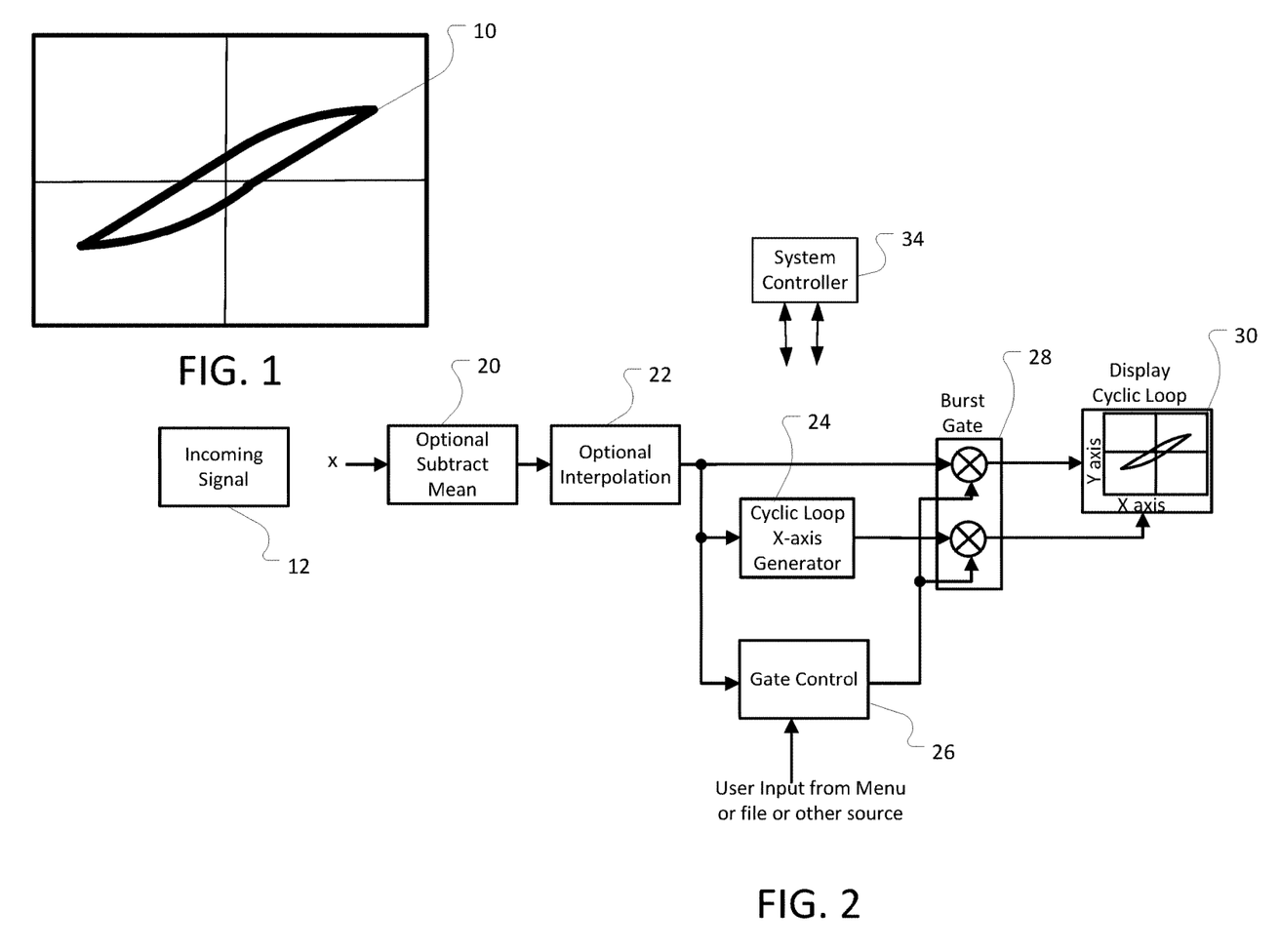
FIG. 1 shows an example of a cyclic loop image for a DDR5 read and write burst.
FIG. 2 shows an embodiment of a general system diagram for generating a cyclic loop image.

The embodiments here involve several processes that create an XY cyclic loop plot or image of the signal. The vertical axis of the plot consists of the incoming waveform signal, and the horizontal axis consists of a sweep signal created by processing the signal. FIG. 1 shows an example of an XY cyclic loop plot 10 for a data burst signal on a two-way bus, such as a DDR5 read and write burst. The vertical axis is the incoming waveform signal. The horizontal axis is a sweep signal created from the incoming waveform signal.

The embodiments provide a novel way to create a linear or a somewhat linear ramp sweep signal only at the edge transitions in the incoming data waveform. No ramps occur in long intervals of highs or long intervals of lows in the incoming digital data. Embodiments automatically position and trigger these ramps such that the XY signal path is a closed loop line containing all rising edges above the upper side of the loop and all negative going edges on the lower side of the loop as shown in FIG. 1. One of ordinary skill in the art will recognize that the plotting of these edges may be reversed; that is, all rising edges may be plotted on the lower side of the loop and all falling edges may be plotted on the upper side of the loop.

Edges in the system contain most of the information defining the system transfer function. Therefore, this cyclic loop image provides a representation of the data waveform that captures all cycles of the waveform in one image and yet eliminates a lot of the extra unnecessary data points that an eye diagram would contain. The resulting plot may, depending on the waveform characteristics, have appearance similarities to magnetic hysteresis BH plots. The specifics of the algorithms' horizontal ramp creation are novel in how it is generated and how it applies to PRBS (pseudo random binary sequence) data patterns.

A major advantage of this is how simple the processes can be to implement and how robust they are. Various embodiments include several methods for creating the X axis ramp like signal. The simpler methods may produce some distortion in the edge shape. For purposes of machine learning system image recognition, the methods will increase compute speed, while at the same time still allowing the machine learning algorithm to classify it. For example, classifying read versus write operations in a memory system by looking only at the DQS or the DQ signal.

One should note that the embodiments are not limited to classifying signals in memory systems. Embodiments may be used for other bi-directional systems where system characteristics may be different depending on the direction of signal propagation. In addition, embodiments may be used for single waveforms in evaluating various characteristics.

The cyclic loop image is a simplified plot that specifically shows signal attributes such as the system response, non-linearity for rising compared to falling edges, SNR, amplitude, reflections delay, reflection coefficient, rise and fall times, etc.

The embodiments produce images well-suited for waveform classification for systems with bidirectional data where the system transfer function is different for each direction. DDR memory with a probe and interposer at the memory position is one example. The XY image created reduces the unnecessary parts of a waveform display and shows only the important attributes needed for classifying the difference between the write operation system response and the read operation system response. The reduced image size and the simplified closed loop path representing the system are well-suited to use as input for a pre-existing, pre-trained image processing neural network or other machine learning system. In addition, multiple measurements can be directly made on the XY plot with user interactive cursors, or with custom software-based measurement algorithms that operate on the cyclic loop data based image. The embodiments include methods to use only the data lines, such as DQS and/or DQ data lines, to identify whether burst signals are read or write.

FIG. 2 shows a general block diagram for a system to generate the cyclic loop image under control of a system controller 34. The incoming signal 12 will generally be a non-return-to-zero (NRZ) signal, although it may also apply to other binary coded signals. The figures identify the incoming signal as x. The system may optionally apply removal of a DC offset from the incoming signal, such as by subtracting the mean of the signal at 20. Additional processing in the form of interpolation or decimation at 22 may optionally increase the number of samples to fill out the cyclic loop diagram, or to reduce the number of samples for other processing reasons.

Whether these optional processes apply or not, the burst gate 28 receives the incoming data signal. The generator 24 will generate a ramp sweep signal for the X-axis of the cyclic loop diagram displayed on the display at 30. FIGS. 3-6 show more detailed embodiments of this generator. The gate control interface 26 may receive an input from a user to determine what segment of the incoming waveform will form the Y-axis portions of the cyclic loop image.

For the embodiments below, the input data may be a continuous signal or burst clock signal such as DQS in a DDR5 memory system. The input signal may be a random data pattern such as a DQ burst interval in a DDR5 memory system. The input signal may be any kind of waveform that has high/low levels with edge transitions with positions determined by a system clock. The X-axis signal is considered to be a linear sweep linear ramp signal or a ramp signal derived from the input signal. This ramp is synchronized with the input signal directly because of the way it is generated.

The embodiments create a cyclic loop diagram that differs from standard eye diagrams because all positive edges are plotted with time incrementing from left to right, and all negative edges are plotted with time incrementing from right to left. This creates a continuous closed loop cyclic path on the XY display image that contains all samples in the waveforms, but that only sweeps along the X axis during the unit intervals (UIs) that contain edges. No X axis sweeps occur during UIs that have no edge transitions.

Figure 3:
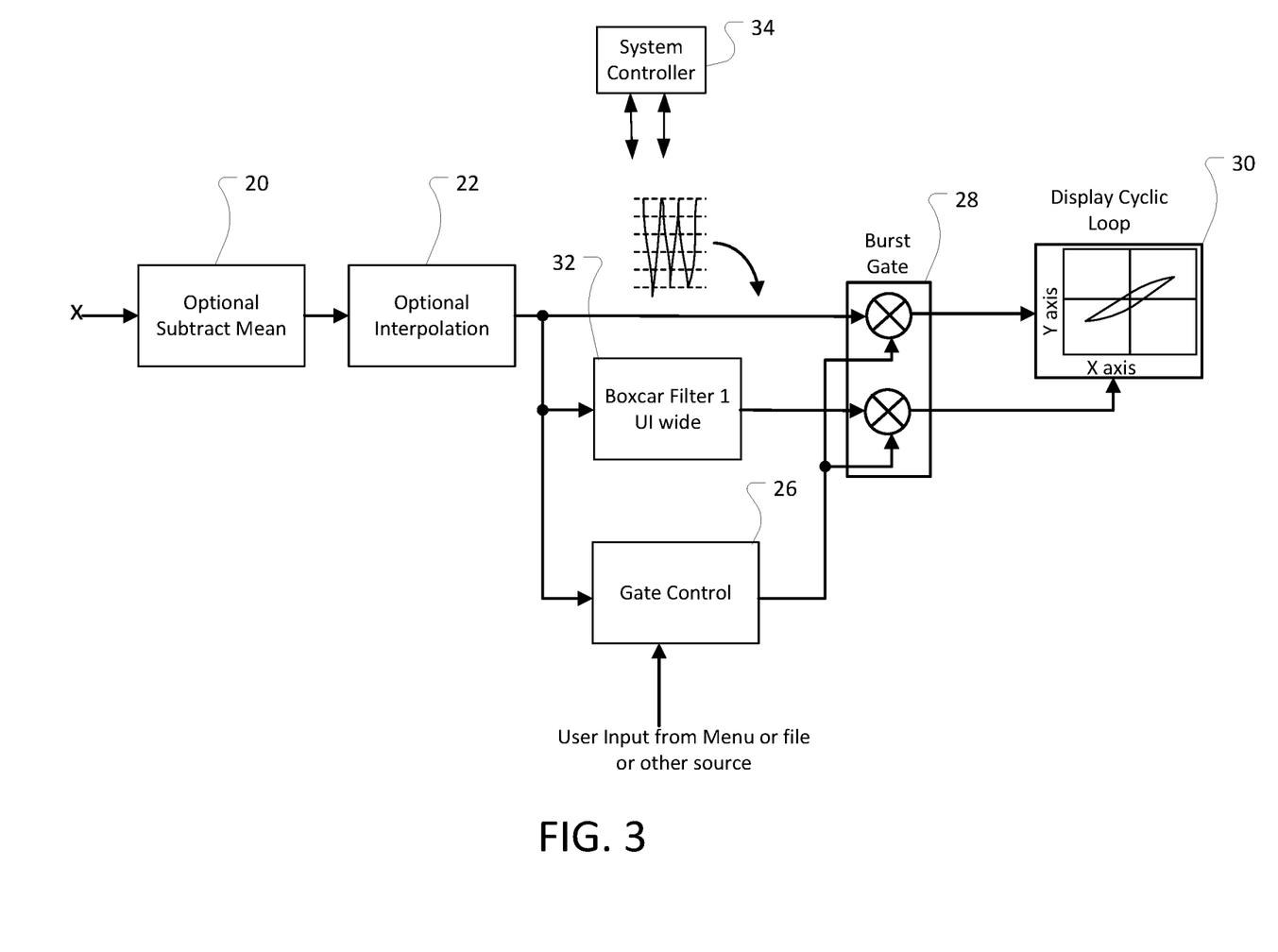
FIG. 3 shows an embodiment of a system diagram for generating a cyclic loop image.

In FIG. 3, the ramp generator employs a boxcar filter 32 applied to the input signal in order to integrate it and turn it into ramp like sweeps for the horizontal X-axis. The boxcar filter will have a length equal to one UI with zero delay output. If the signal has low loss and is relatively square, then this results in relatively linear sweep ramps that occur only at the edge transitions. If the signal is high loss, then the ramp is less linear, and the edge plots have resulting distortion. For some applications, these distortions may not cause any issues with image classification performed by a machine learning system. As used here, the term "machine learning" means a subset of artificial intelligence that involves computer nodes, neural networks, etc.

The example system of FIG. 3 is the simplest in terms of computation. The signal is applied through burst gate 28 block to the Y axis of the XY display image data base and display 30. In addition, for the X axis path, the signal is transformed by a boxcar filter 32 which is one UI, unit interval, in length. The boxcar filter 32 may be a finite-impulse-response (FIR) filter where all coefficients have a value of 1/N where N is the number of coefficients. This basically performs localized integration of the input waveform over one UI interval. A unique aspect of this appears if the input signal has square corners and flat tops, such as multiple steps, then the resulting waveform contains ramps that are each 1 UI wide and that occur with the edges in the center region of the ramp. This assumes the boxcar filter is computed with zero delay.

For the case where the input signal has high inter-symbol interference (ISI), the corners are more rounded, and the resulting ramps will be non-linear. This will result in distortion of the edge representation in the XY display. However, even this distorted image may still be useful as an input image for classifying signals to determine the difference between a read and a write operation.

The burst gate 28 determines how many waveform samples will be saved into the cyclic loop data base and resulting cyclic loop image display 30. The Gate Control block 26 is basically a trigger system that determines what portion of the signal is gated. It may consist of any type of control that may be programmed for making that determination. That includes input from menus by the user to determine what type of trigger or what gate positions in a waveform acquired data record shall be included.

The image consists of an XY plot image that can be thought of as similar to XY scope plots where there the input signal is placed on the Y axis and a ramp type of sweep signal synchronized to positions on the signal, x, is placed on the X-axis. The signal, x, on the vertical axis. The triggered ramp sweep signal is on the horizontal axis. Color mapping, intensity shading, etc., if used, will lie on the Z-axis. The plot has relatively low-resolution image data that can be used as input to a deep learning neural network to train for classification. The system may store the plot as an image file that may be used for machine learning and deep learning waveform classification algorithms.

The system controller 34 applies to all the embodiments. The system controller may comprise one or more processors, such as general purpose processor in a separate computing device, a processor in a test and measurement device such as an oscilloscope, distributed between the two devices, or distributed between one or both of those devices and cloud computing resources.

Figure 4:
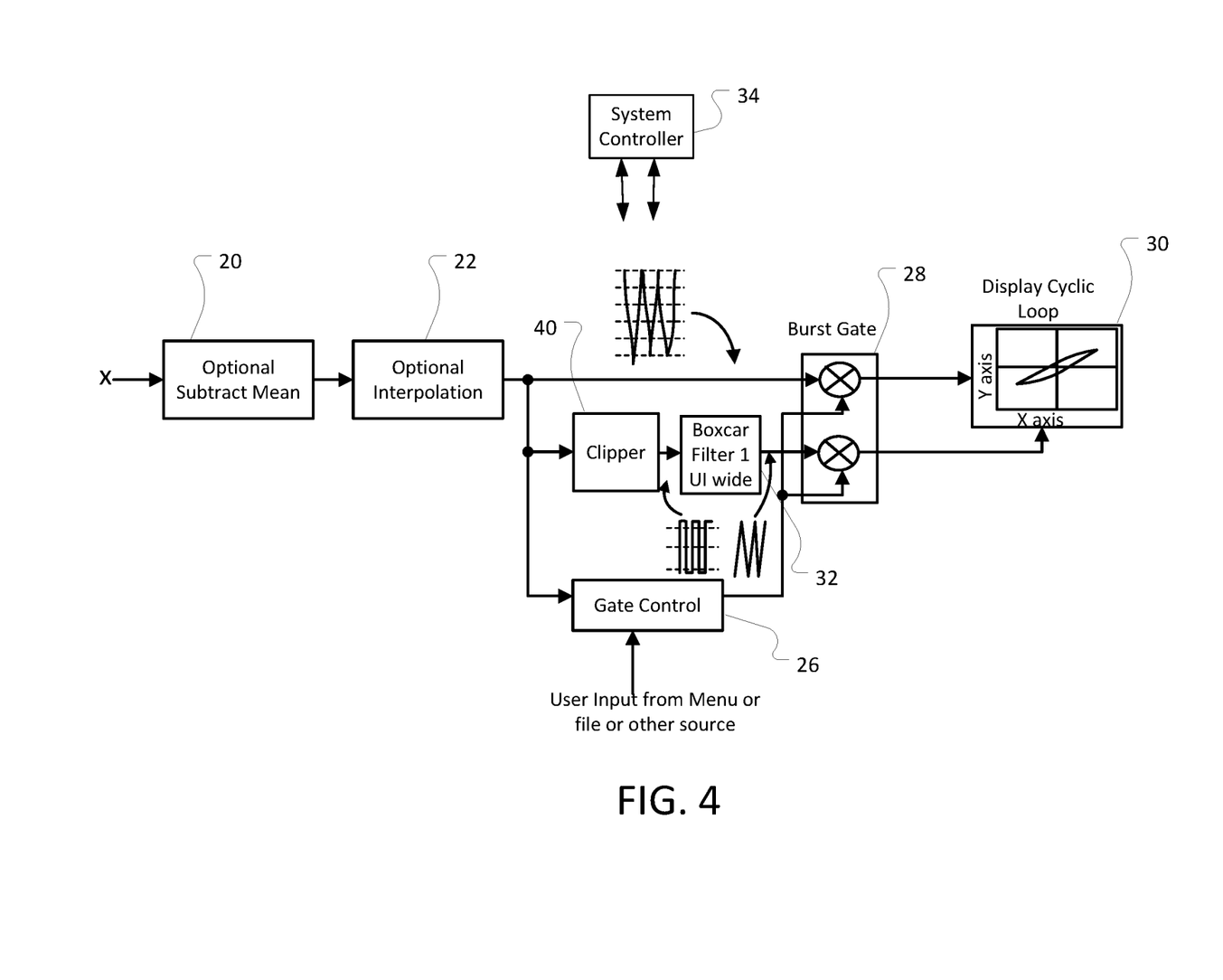
FIG. 4 shows an embodiment of a system diagram for generating a cyclic loop image.

The ramp generator embodiment in FIG. 4 also uses the boxcar filter 32, but has an added element referred to here as a "clipper." The clipper 40 recovers an ideal, square-cornered, signal from the input signal and then applies the boxcar filter 32 with zero delay output. This results in linear ramps for the X-axis ramp sweep signal. The ramps only occur when there are edge transitions in the incoming waveform signal.

This embodiment generates a cyclic loop image that captures all of the edge transitions into a single closed-loop XY plot that simply cycles over somewhat the same cyclic path across the entire length of the input data record. Deviation from the cyclic loop path is determined by ISI, noise, reflections, etc. The image includes all data points in the record, however, only the edge transitions are captured in the mid loop area of the display while all UI samples over intervals of high and low with no transitions are overlaid at the ends of the sweep range of the X-axis. For all positive edges, the X-axis in units of seconds increase from left to right. For all negative edges, the X-axis in units of seconds increase from right to left. These sweeps from left to right or from right to left only occur during UI intervals that contain edge transitions. This differs from the well-established Lissajous figures, and with classic magnetic hysteresis loop diagram displays.

In the example embodiment of FIG. 4, the horizontal sweep ramps are generated by first running the input signal through a clipper functional block 40. This block multiplies the signal by 500, or some other large number, and then if the signal is greater than zero it is assigned to an ideal high value constant that will typically be same as the input voltage nominal high level. If the signal is less than or equal to zero it is assigned to the low-level constant value. This creates an ideal square pulse representation of the input signal.

The boxcar filter 32 acts as a short-term integrator. The width of the boxcar filter may be equal in width to one UI of the input signal. Since there are an integer number of coefficients, it may be the number of coefficients at the given sample rate that is equal to the UI interval, or a fraction of a sample interval less than the UI width. The delay of the boxcar filter may be zero. This creates a positive going linear ramp like signal during the time period of positive edges of the input signal, and it create a negative going linear ramp signal for time periods during a falling edge of the input signal. For long intervals of multiple UI where there are no edges, there is no ramp. This is one of the differences of these approaches because this results in only positive and negative edge positions appearing in the closed loop path of the cyclic loop diagram.

All data for multiple UI intervals with no edges is in the graph, but only displayed at two points on screen such that only the edges showing the characteristics of the system model are fully visible in a simple looped path on the screen. If the ISI is high, then there will be a wider variation of paths followed around the loop. This will cause the loop to close more. For a clock signal that changes for every UI the entire waveform data set repeatedly traces around the same closed loop path on the XY display. This is also a novel aspect of embodiments of the disclosure, because all edges are traced along the looping path. This results in the cyclic loop that does not have a lot of overlays between positive and negative transitions, which tends to obscure much of the signal detail in typical eye diagrams.

The gate control 26 basically operates like a trigger in typical analog scopes except that it can be more complex under program control. It determines what portion of the input signal, x, will be processed into the cyclic loop display image. The burst gate 28 is shown as a multiplier, which can have the input signal and a 1 or 0 input from the gate control 26. The burst gate 28 determines how many waveform samples will be saved into the cyclic loop data base and resulting cyclic loop image display 30. The Gate Control block 26 determines what portion of the signal is gated. Therefore, the main system controller 34 may sequence the entire system so that only one burst at a time is processed and classified.

Figure 5:
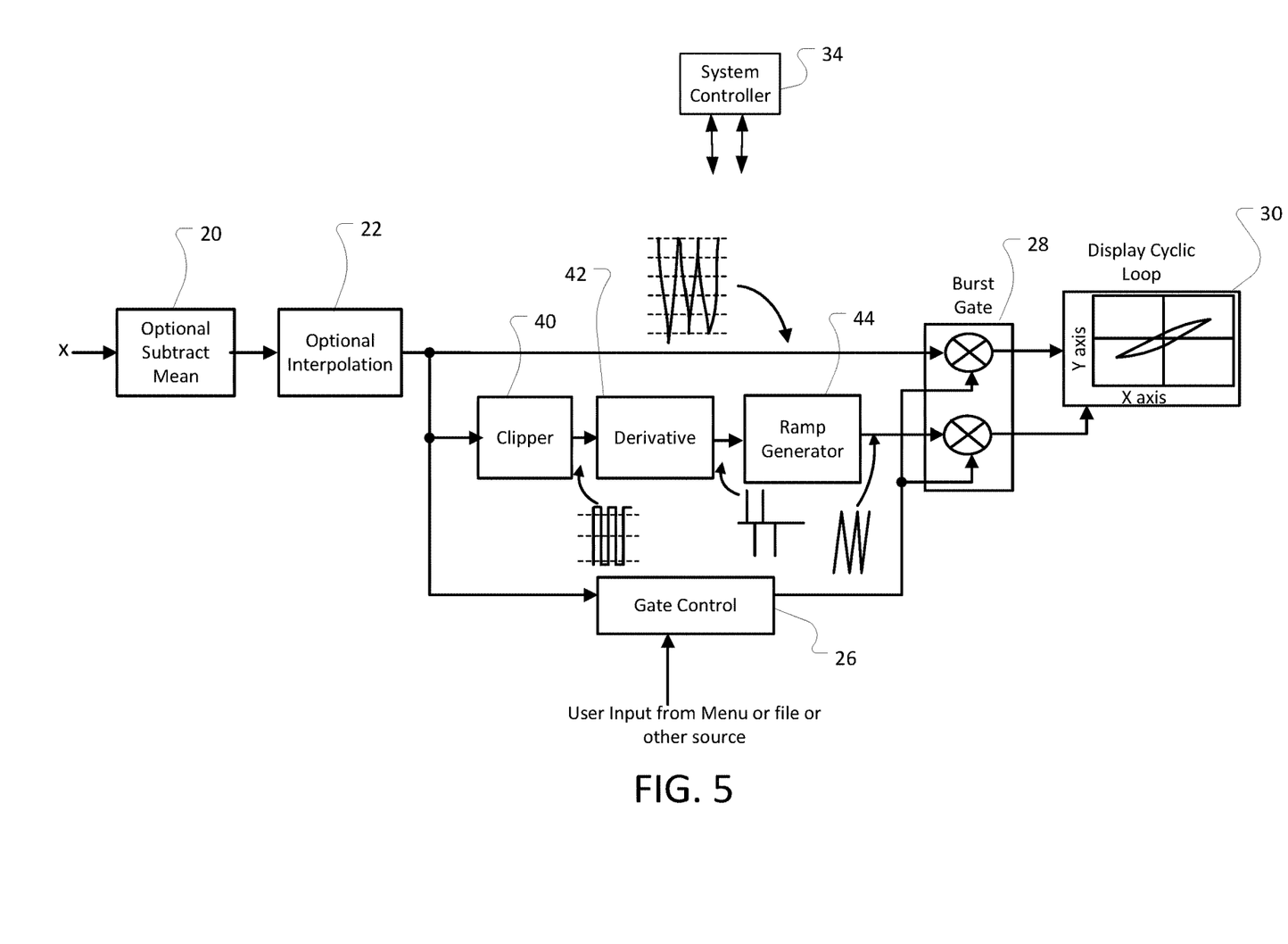
FIG. 5 shows an embodiment of a system diagram for generating a cyclic loop image.

FIG. 5 uses a derivative process 42 of the clipper 40 output to create trigger pulses that specify where to start a fixed amplitude constant slope ramp that sweeps over one UI interval. This leaves the edge transition in the middle of the interval. This embodiment will typically not have any edge distortion in the image. However, using a derivative of the clipper signal, meaning that only the edges derived from the clipper signal are used, may introduce jitter into the data to be displayed.

The example embodiment of FIG. 5 uses the derivative of the clipper output to generate trigger spikes that will indicate the start times to the ramp generator 44 for computing linear ramps of constant amplitude with a width of one UI interval. The ramps will have positive slope starting from a low to a high value if the trigger spike is positive going. The ramp will have negative slope starting from high to the low value if the trigger spike is negative. The ramp output signal will stay high or stay low if the next UI does not have an edge transition. The ramp generator will compute linear ramps all having the same amplitude and slope that cover a 1 UI interval.

Figure 6:
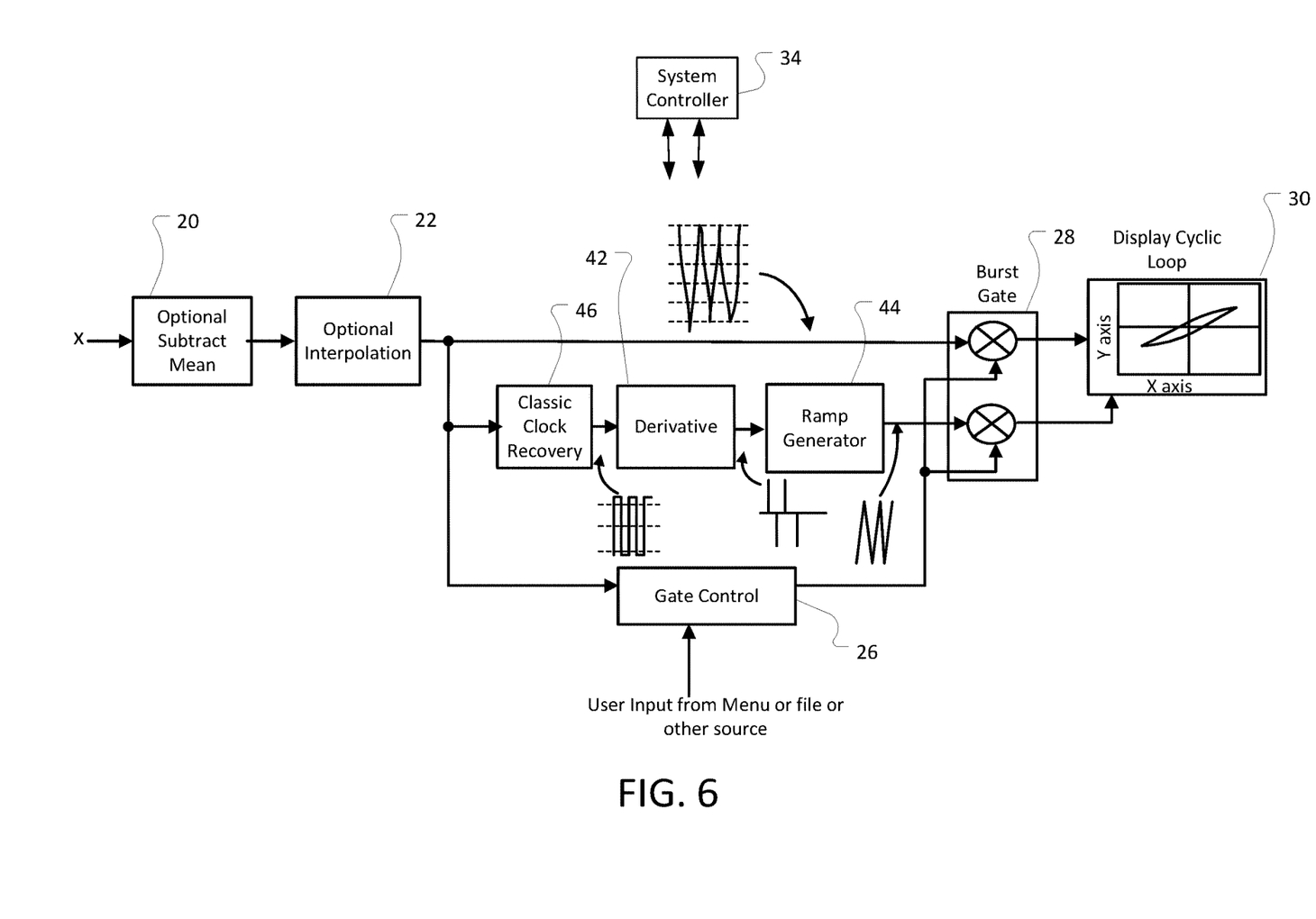
FIG. 6 shows an embodiment of a system diagram for generating a cyclic loop image.

The embodiment of FIG. 6 may avoid the jitter mentioned above by using a classic clock recovery process 46, in which in the clock is recovered from the incoming signal. The added complexity of the additional elements will more than likely require more computing power and time than the other embodiments described above. This system substitutes classic clock recovery algorithms using phase locked loops (PLLs) and Fast Fourier Transform (FFT) algorithms to create a clock signal that is capable of tracking spread spectrum clocking (SSC), when present, and to be used by the derivative block 42. The output of the clock recovery block 46 is a square wave which is similar to the output of the clipper in the systems of FIGS. 4 and 5. This classic clock recovery 46 has associated with it menu control with user input to specify parameters of the clock recovery system that is used. This approach may send the recovered clock directly rather than using it to generate trigger spikes, although that is also an option.

Figure 7:
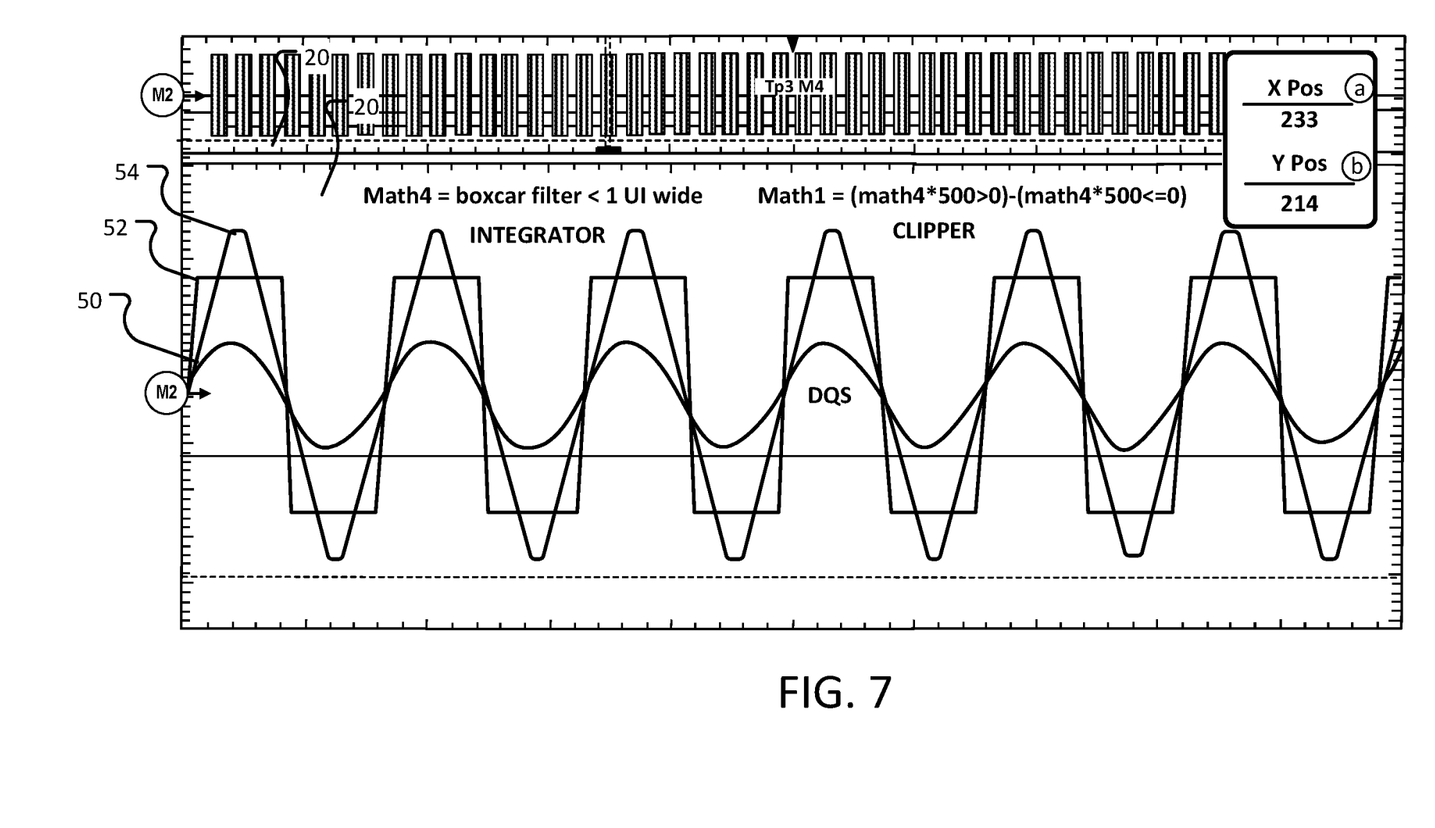
FIG. 7 shows an example of an oscilloscope screen of the waveforms used for creating a cyclic loop diagram.

FIG. 7 shows an example oscilloscope display of the waveforms created for making the cyclic loop diagram using the clipper followed by a boxcar filter. In this view, the somewhat sinusoidal looking waveform 50 is a DQS clock signal. The output of the clipper is shown as a square wave 52. The ramp signal is the output of the boxcar filter 54.

Figure 8:
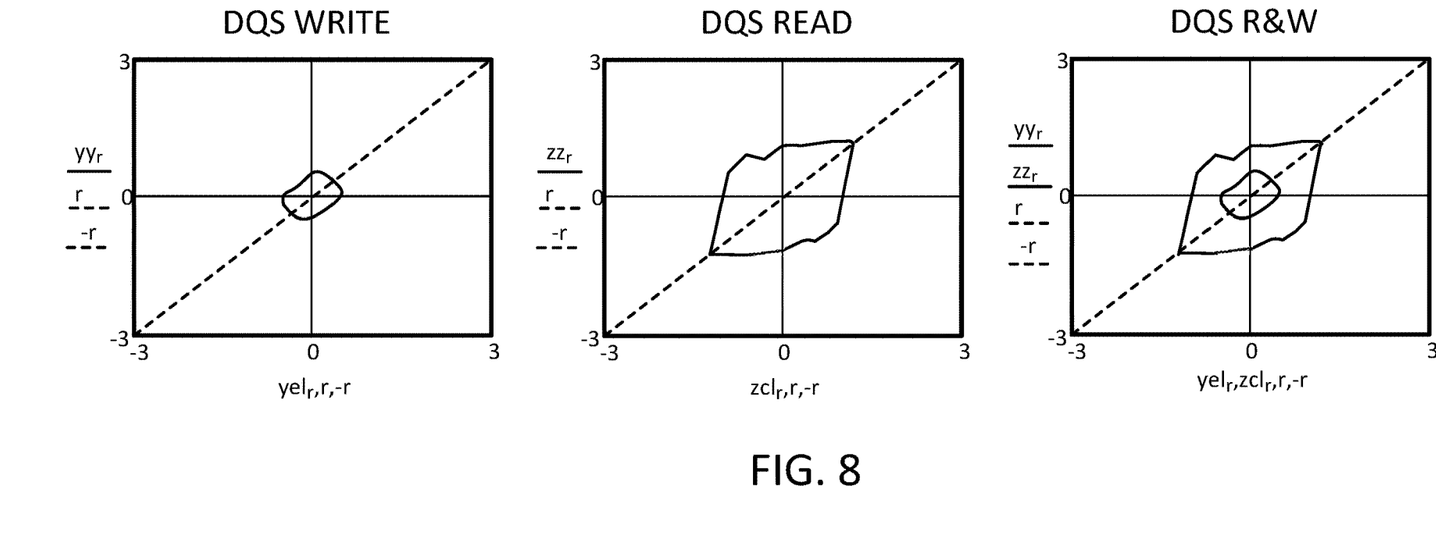
FIG. 8 shows examples of cyclic loop images.

FIG. 8 shows examples of cyclic loop diagrams. The first plot at left shows an example of a cyclic loop DQS signal for a write operation. The middle diagram shows an example of a cyclic loop DQS signal for a read operation. The third plot at the right shows the DQS read cyclic loop and the DQS write cyclic loop plotted on the same axis.

Figure 9:
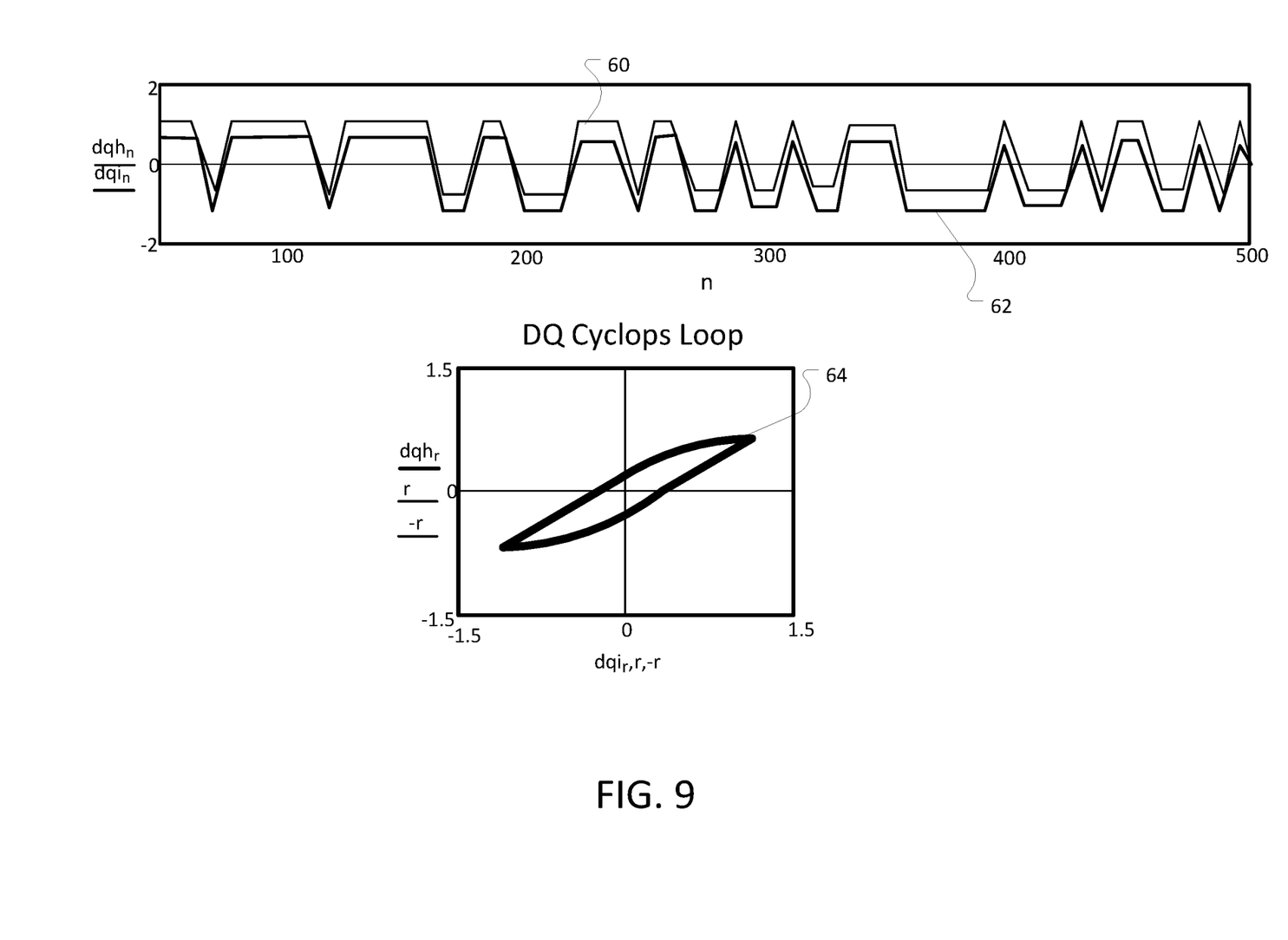
FIG. 9 shows a standard DQ waveform and a ramp signal created from it, and the resulting cyclic loop image.

FIG. 9 shows an example of a random data pattern shown as the lower trace 62 that is applied to the Y axis. The X axis ramp trace is the upper trace 60. The resulting cyclic loop 64 is shown on the XY plot.

Figure 10:
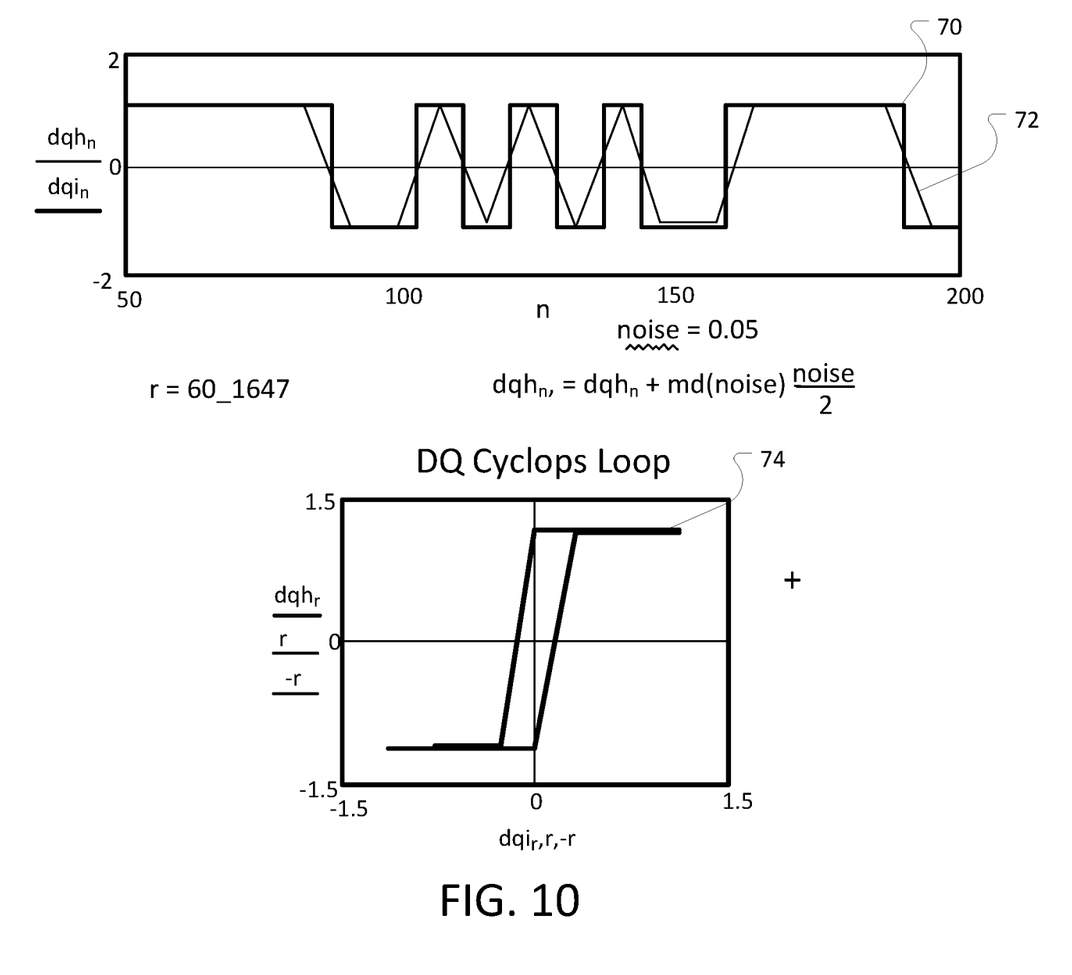
FIG. 10 shows an example of a DQ random data signal with no reflections and no ISI and the resulting cyclic loop image.

FIG. 10 shows a second example of a random square corner pulse pattern 70, which is applied to the Y axis of the XY display, and the ramp signals 72 for the X axis. The resulting cyclic loop 74 is shown on the XY plot. The positive edges look the same as typical XT, x versus time, displays except that many edges are overlaid. The negative going pules are still of correct polarity, but the time axis is reversed to sweep right to left.

Figure 11:
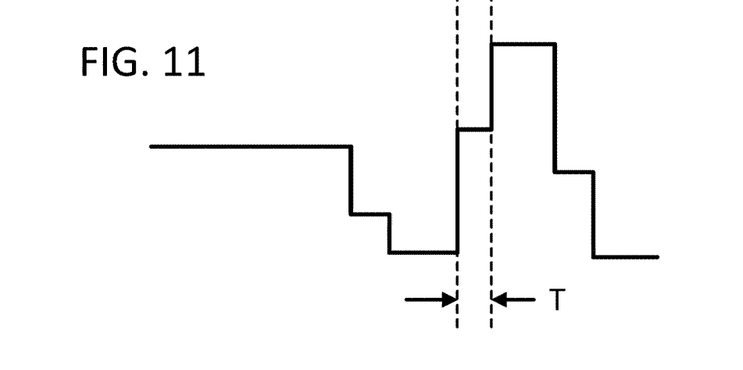
FIG. 11 shows an example of a measurement from a standard YT trace display.

The cyclic loop diagrams can allow the user to make measurements, such as the reflection delay between the probe and memory load. For example, a standard YT trace display as shown in FIG. 11 may allow measurement of the interval T. The trace delay then results from the equation delay=T/2.

Figure 12:
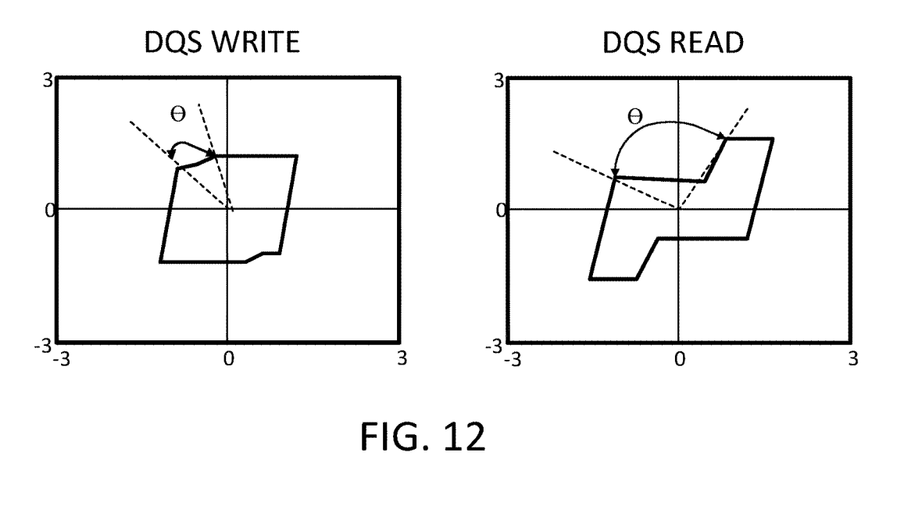
FIG. 12 shows an example of measuring reflection delay.

The cyclic loop diagrams of FIG. 12 may also provide the ability to make the same measurements. The diagrams represent the delay as a phase angle, $\theta$, in degrees. For both cases the waveform is shown with no trace ISI loss in order to simplify the view to show the points at which to measure a phase angle, $\theta$, in order to compute the reflection delay time. The delay can be found by: delay=$(\theta/(360*bitRate))$, where the angle is in degrees and the delay has a unit of seconds. The data rate of the signal is the bitRate.

Figure 13:
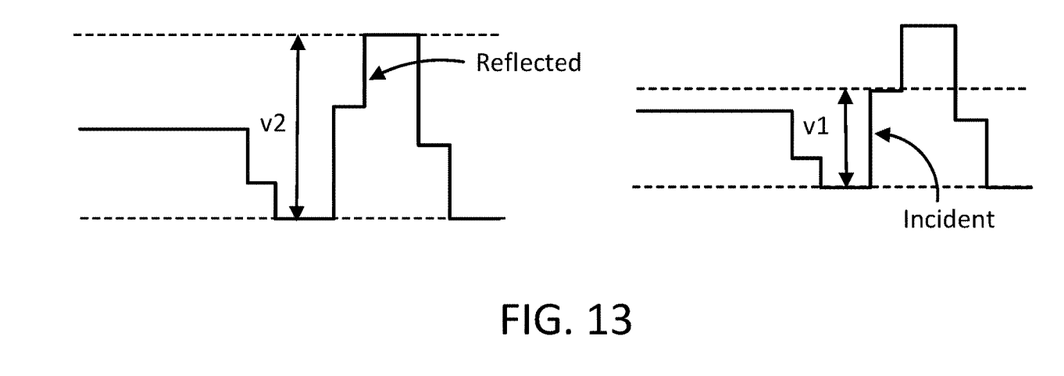
FIG. 13 shows examples of measuring coefficients.
Figure 14:
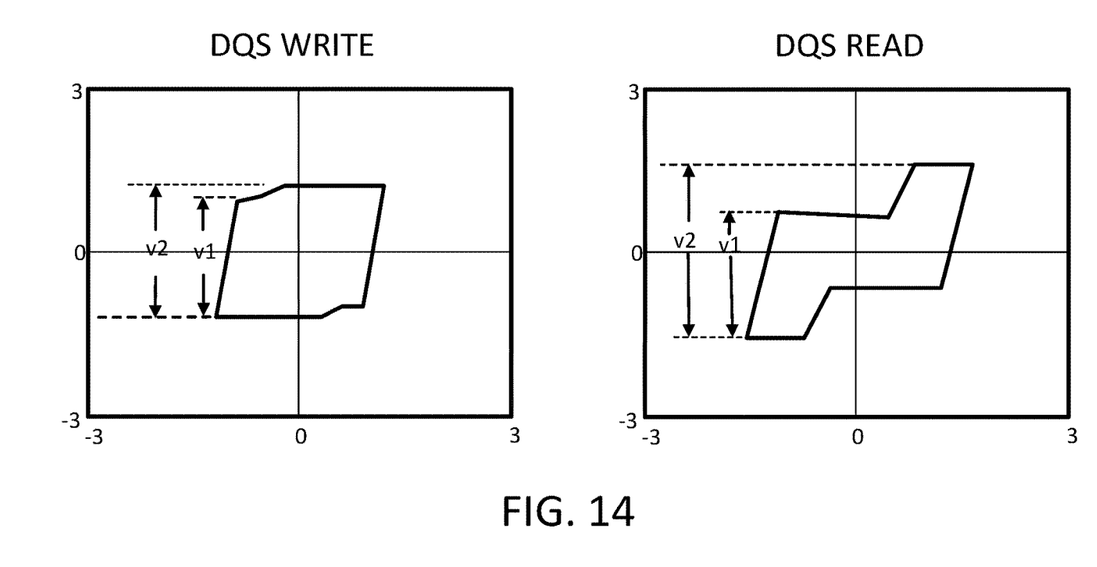
FIG. 14 shows an example of measuring reflection coefficients using the cyclic loop diagram.

Reflection coefficient for the short trace between probe and memory can be measured on a standard YT type of waveform display as shown in FIG. 13. The reflection coefficient is then computed as: $\Gamma=(v2-v1)/v1$. Once the reflection coefficient is known the impedance of the load, Z, or the characteristic impedance $Z_0$ can be computed if one of them is known, by $Z=Z_0\cdot(1+\Gamma)/(1-\Gamma)$. The reflection coefficient may be measured using the cyclic loop diagram by measuring the v1 and v2 voltage levels as shown in FIG. 14.

The disclosure presents several methods for creating a cyclic loop image that provides a more sparse data set that better shows the system characteristics than a standard eye diagram. Therefore, the cyclic loop image is better suited for use with machine learning and deep learning algorithms that perform waveform classification, such as the classification of read versus write operations in memory systems.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a system, comprising: an input to receive a non-return-to-zero (NRZ) waveform signal; and one or more processors configured to execute code to cause the one or more processors to: use the NRZ waveform signal to generate a ramp sweep signal; gate the ramp sweep signal and the NRZ waveform signal to produce gated X-axis and Y-axis data; and display the gated X-axis and Y-axis data as a cyclic loop image.

Example 2 is the system of Example 1, further comprising a memory to store the gated X-axis and Y-axis data.

Example 3 is the system of either Examples 1 or 2, wherein the code to cause the one or more processors to generate a ramp sweep signal comprises code to cause the one or more processors to apply a boxcar filter to the input waveform.

Example 4 is the system of Example 3, wherein the code to cause the one or more processors to generate a ramp sweep signal comprises code to cause the one or more processors to clip the NRZ waveform signal prior to applying the boxcar filter.

Example 5 is the system of either Examples 3 or 4, wherein the code to cause the one or more processors to generate a ramp sweep signal comprises code to cause the one or more processors to: clip the NRZ waveform signal to produce a clipped waveform; use a derivative of the clipped waveform to generate trigger spikes to indicate start times for ramps in the ramp sweep signal; and generate the ramps as the ramp sweep signal based on the start times for the ramps.

Example 6 the system of any of the Examples 1-5, wherein the code to cause the one or more processors to generate a ramp sweep signal comprises code to cause the one or more processors to: perform clock recovery to produce a clock signal; use the clock signal to indicate start times for ramps; and generate the ramp sweep signal based on the start times for the ramps.

Example 7 is the system of any of the Examples 1-6, wherein the code to cause the one or more processors to execute code to gate the ramp sweep signal and the NRZ waveform signal comprises code to cause the one or more processors to gate the ramp sweep signal and the NRZ waveform signal according to a user input.

Example 8 is the system of any of the Examples 1-7, wherein the one or more processors are further configured to execute code to cause the one or more processors to make a measurement from the cyclic loop image.

Example 9 is the system of Example 8, wherein the code to cause the one or more processors to execute code make the measurement from the cyclic loop image comprises code to cause the one or more processors to measure a reflection delay from a phase angle in the cyclic loop image divided by 360 multiplied by a data rate of the NRZ waveform signal.

Example 10 is the system of Example 9, wherein the code to cause the one or more processors to execute code to make the measurement comprises code to cause the one or more processors to measure a reflection coefficient from a different between voltages represented by values on the cyclic loop image.

Example 11 is a method of generating a cyclic loop image, comprising: receiving an input waveform; using the waveform to generate a ramp sweep signal; gating the ramp sweep signal and the input waveform to produce gated X-axis and Y-axis data; and displaying the gated X-axis and Y-axis data as a cyclic loop image.

Example 12 is the method of Example 11, further comprising storing the cyclic loop image in a memory.

Example 13 is the method of either of the Examples 11 or 12, wherein using the input waveform to generate the ramp sweep signal comprises applying a boxcar filter to the input waveform.

Example 14 is the method of Example 13, wherein using the input waveform to generate the ramp sweep signal comprises clipping the input waveform prior to applying the boxcar filter.

Example 15 is the method of any of the Examples 11-14, wherein using the input waveform to generate the ramp sweep signal comprises: clipping the input waveform to produce a clipped waveform; using a derivative of the clipped waveform to generate trigger spikes to indicate start times for ramps in the ramp sweep signal; and generating the ramp sweep signal based on the start times for the ramps.

Example 16 is the method of any of the Examples 11-15, wherein using the input waveform to generate the ramp sweep signal comprises: performing clock recovery to produce a clock signal; using the clock signal to indicate the start times for ramps in the ramp sweep signal; and generating the ramp sweep signal based on the start times for ramps.

Example 17 is the method of Example 11, further comprising making a measurement from the cyclic loop image.

Example 18 is the method of Example 17, wherein making the measurement comprises measuring a reflection delay from a phase angle in the cyclic loop image divided by 360 multiplied by a data rate of the waveform signal.

Example 19 is the method of Example 17, wherein the making the measurement comprises measuring a reflection coefficient from a different between voltages represented by values on the cyclic loop image.

Example 20 is a test and measurement instrument, comprising: an input to receive a non-return-to-zero (NRZ) waveform signal; a ramp generator to use the NRZ waveform signal to generate a ramp sweep signal; a gate to gate the ramp sweep signal and the NRZ waveform signal to produce gated X-axis and Y-axis data; and a display to display the gated X-axis and Y-axis data as a cyclic loop image.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

What is claimed is:

1. A method of generating a cyclic loop image, comprising:
   receiving an input waveform;
   using the input waveform to generate a ramp sweep signal derived from digital data contained in the input waveform;
   receiving a gate input indicating what portion of the input waveform is gated;
   in response to the gate input, gating the ramp sweep signal and the portion of the input waveform to produce gated X-axis and Y-axis data; and displaying the gated X-axis and Y-axis data as a cyclic loop image.

2. The method as claimed in claim 1, further comprising storing the cyclic loop image in a memory.

3. The method as claimed in claim 1, wherein using the input waveform to generate the ramp sweep signal comprises applying a boxcar filter to the input waveform.

4. The method as claimed in claim 3, wherein using the input waveform to generate the ramp sweep signal comprises clipping the input waveform prior to applying the boxcar filter.

5. The method as claimed in claim 1, wherein using the input waveform to generate the ramp sweep signal comprises:

clipping the input waveform to produce a clipped waveform;

using a derivative of the clipped waveform to generate trigger spikes to indicate start times for ramps in the ramp sweep signal; and generating the ramp sweep signal based on the start times for ramps.

6. The method as claimed in claim 1, wherein using the input waveform to generate the ramp sweep signal comprises:

performing clock recovery to produce a clock signal;

using the clock signal to indicate the start times for ramps in the ramp sweep signal; and generating the ramp sweep signal based on the start times for ramps.

7. The method as claimed in claim 1, further comprising making a measurement from the cyclic loop image.

8. The method as claimed in claim 7, wherein making the measurement comprises measuring a reflection delay from a phase angle in the cyclic loop image divided by 360 multiplied by a data rate of the waveform signal.

9. The method as claimed in claim 7, wherein the making the measurement comprises measuring a reflection coefficient from a difference between voltages represented by values on the cyclic loop image.

10. A test and measurement instrument, comprising:

an input to receive a non-return-to-zero (NRZ) waveform signal;

a ramp generator to use the NRZ waveform signal to generate a ramp sweep signal derived from digital data contained in the NRZ waveform signal;

a gate to gate the ramp sweep signal and a portion of the NRZ waveform signal in response to a gate input, wherein the portion of the NRZ waveform signal is determined by the gate input, to produce gated X-axis and Y-axis data; and a display to display the gated X-axis and Y-axis data as a cyclic loop image.

* * * * *